United States Patent [19]

Huang et al.

[11] Patent Number: 5,062,896
[45] Date of Patent: Nov. 5, 1991

[54] SOLDER/POLYMER COMPOSITE PASTE AND METHOD

[75] Inventors: Wu-Song Huang, Poughkeepsie; Igor Y. Khandros, Peekskill; Ravi Saraf, Croton-on-Hudson; Leathen Shi, Yorktown Heights, all of N.Y.

[73] Assignee: International Business Machines Corporation, Armonk, N.Y.

[21] Appl. No.: 502,090

[22] Filed: Mar. 30, 1990

[51] Int. Cl.$^5$ .............................................. B23K 35/34
[52] U.S. Cl. ................................. 106/287.19; 148/24; 252/512; 252/514
[58] Field of Search ............... 106/287.19, 1.14; 252/514, 512; 148/24

[56] References Cited

U.S. PATENT DOCUMENTS

| | | | |
|---|---|---|---|
| 4,419,279 | 12/1963 | Abrams | 252/514 |
| 4,496,475 | 1/1985 | Abrams | 252/514 |
| 4,545,926 | 10/1985 | Fouts, Jr. et al. | 252/511 |
| 4,557,860 | 12/1985 | DiSalvo et al. | 252/512 |
| 4,574,056 | 3/1986 | Kimura | 252/514 |
| 4,619,715 | 10/1986 | Hwang | 148/23 |

*Primary Examiner*—William R. Dixon, Jr.
*Assistant Examiner*—Alan Wright
*Attorney, Agent, or Firm*—Perman & Green

[57] ABSTRACT

An improved solder/polymer fluxless composite paste interconnection material having a low reflow temperature to form electrical contacts having good bonding strength and low contact resistance. The present pastes comprise a major proportion of a meltable metal alloy powder filler, free of noble metals and preferably free of lead, a minor proportion of a solution of a temperature-stable thermoplastic polymer having a softening temperature above the melting temperature of the metal powder filler in a volatile solvent which evaporates during reflow, and a minor proportion of a fluxing agent having a boiling point lower than the reflow temperature of the composition and higher than the melting point of the eutectic alloy powder filler. An oxide-free, partially coalesced metal alloy connection is obtained, which is polymer strengthened and reworkable at a low reflow temperature, per se, or in the presence of polymer solvent.

16 Claims, No Drawings

SOLDER/POLYMER COMPOSITE PASTE AND METHOD

FIELD OF THE INVENTION

The present invention relates to novel interconnection materials for forming electroconductive connections between electroconductive members, and to the method for producing such electroconductive connections.

DISCUSSION OF THE PRIOR ART

Electroconductive solder compositions are well known for forming conductive connections between conductive members such as between electrical components such as the leads of chip carriers and pads associated with circuits printed on a circuit board. Conventional solder compositions comprise eutectic alloy powders such as tin-lead compositions which require the use of resident flux compositions to clean oxides from the solder metals and from conductive members being connected and which require after-cleaning to remove the flux, and require high reflow temperatures which can damage delicate electrical components. Lead-containing solder powders also are environmentally undesirable.

It is also known to provide metal alloy powder-filled polymer composite pastes to achieve non-cleaning or fluxless soldering. However such pastes include non-oxidizing, non-melting silver or gold alloy powder fillers, which are expensive. Also, silver-migration causes other problems.

A solderable polymer film composition is disclosed in U.S. Pat. No. 4,548,879, comprising nickel powder filler and a solution of a thermosetting polymer in a volatile solvent, the polymer being cured during the application process. Such pastes cure during application so that the polymer thereof is not softenable at low reflow temperatures or solvent-soluble at low reflow temperatures.

SUMMARY OF THE INVENTION

It is an objective of the present invention to provide meltable alloy powder/polymer composite pastes which are free of expensive noble metal fillers, preferably free of toxic lead metal fillers, and are based upon thermoplastic polymer binder materials which are soluble in organic solvents having a boiling point above the melting temperature of the metal solder particles and at or slightly below the reflow temperature, the polymer being heat-softenable above the melting temperature of the metal solder particle filler and below the reflow temperature, the latter temperature being lower than the thermal stability temperature of the thermoplastic polymer and of the printed circuit board to avoid damage to sensitive electrical components. The above described paste/composite is referred to a polymer-solder composite (PSC).

The present invention is based upon the discovery that certain, multicomponent thermoplastic polymers provide excellent binder materials for meltable metal alloy powder fillers to produce alloy powder/polymer composite pastes which do not require flux cleaning upon joining, without containing noble metal alloy powders, and which are reworkable with or without the presence of volatile organic solvents at relatively low reflow temperatures which do not damage sensitive electrical components. The preferred compositions of the present invention contain poly(imide siloxane) binder material dissolved in N-methyl pyrrolidone, 1-2-bis(2-methoxy-ethyoxy)ethane, or methyl phenyl butone as an organic solvent which boils at a temperature above the melting point of the metal alloy powder and completely evaporates during reflow. The preferred alloy powders are eutectic bismuth-tin alloys, free of noble metals and free of toxic lead, although eutectic bismuth-tin-lead alloy powder and eutectic lead-tin alloy powders can also be used where toxicity is not a problem.

The present compositions also contain a minor amount of a saturated monocarboxylic acid as a transient fluxing agent, which acid has a boiling point above the melting point of the alloy powder but at or below the reflow temperature of the composition.

The present compositions also preferably contain a minor amount of a polyhydric alcohol surface active agent/fluxing agent, such alcohol having a boiling point above the melting point of the metal alloy powder and at or below the reflow temperature of the composition.

The novel PSC joint of the present invention can be reworked by simply heating above the softening temperature of the polymer matrix with or without applying thereto an organic solvent for the polymer, whereby the strong solder joints made of the present compositions can be released to permit the removal of one of the electrical components, such as a damaged chip material component from a PCB, and the replacement thereof with a new electrical component at low reflow temperatures.

DETAILED DESCRIPTION

The novel composite pastes of the present invention provide a novel solder connection which is made possible by the nature and interaction of the components of the solder composition. The present solder joint, i.e., the reflowed solder compositions, comprise a partially coalesced interconnected network of the meltable metal powder filler having a cured thermoplastic polymer which strengthens the solder structure and, depending on the processing conditions can encapsulate the structure.

The interconnected network is important for several reasons. In the course of forming the solder connection, i.e., during reflow, the metal powder particles melt and weld to adjacent powder particles and to the electrical leads immersed therein. However the presence of the thermoplastic polymer, and its volatile solvent, causes the solder particles to form a network rather than fully coalesce or melt to a homogeneous mass at the reflow temperature. The particle network structure is electroconductive whereas the original solder paste is not electroconductive.

During reflow the transient flux materials remove oxides on the meltable metal alloy particle surface to facilitate coalescence and welding of the particles into an electrically conducting, partially coalesced network, while the cleaning action on the pads and leads provides electroconductive interconnection. The flux materials perform their intended function and then escape completely from the PSC joint when the temperature rises to or above their boiling temperature, thereby avoiding the need to clean the flux from the connections. This is the meaning of "Transient Flux".

These features of the present compositions enable them to be fluxless, i.e., free of residual fluxes which must be cleaned, and yet to be based upon inexpensive oxidizable metal powder fillers such as tin alloys rather than expensive noble metals. Also the present metal alloy powders may be free of lead, if necessary.

The essential components of the novel composite solder compositions of the present invention comprise a thermally stable and acid-resistant thermoplastic polymer, a volatile organic solvent for said polymer, a meltable metal alloy powder filler having a melting temperature below the boiling point of said organic solvent, and a transient flux for reducing metal oxides formed on said metal powder particles, or preventing the formation thereof, said flux having a boiling point above the melting point of said metal powder and below the maximum reflow temperature.

The present paste compositions generally contain a major amount by weight of eutectic metal alloy powder filler, i.e., between about 85% and 93% based upon the total weight of the paste. Suitable alloys include all of those used in conventional solder powder compositions, including expensive noble metals, if desired. The melting temperature of the metal alloy powder is selected based upon the environment in which the paste is used. That is, if an epoxy substrate/PCB is used the melting temperature is selected to be below the thermal stability temperature of the epoxy, whereas if a ceramic substrate is used the melting temperature is selected to be below the thermal stability of the matrix polymer of the paste (for example 400° C. for amorphous Teflon, AF 600). Pollutant lead alloys can be excluded if desired. For a lead free porous, eutectic Bi-Sn alloys powders can be used which have a melting temperature in the area of about 138° C. and have a particle size of about −325 mesh.

Where the presence of lead is not a problem, the suitable eutectic alloy powder fillers include Pb-Sn powder, melting temperature about 183° C. and mesh size −325, ternary Bi-Sn-Pb powder (46–50% Bi, 20–28% Pb and 22–34% Sn), melting temperature about 100° C. and mesh size −325, and other conventional alloy powders of similar particle size and with melting temperatures below about 200° C. and below the boiling temperature of the transient fluxing material and of the volatile organic solvent for the polymer.

The present paste compositions contain between about 7% and 14% by weight of a solution of the thermoplastic organic polymer which is thermally stable at maximum reflow temperatures, i.e., below about 350° C., dissolved in a volatile organic solvent having a boiling point above the melting temperature of the alloy powder and below the maximum reflow temperature of the composite paste composition. The polymer solution generally contains about 15% to 30% by weight of the polymer dissolved in from about 70% to 85% by weight of one or more volatile organic solvents.

A preferred thermoplastic polymer is a poly(imide siloxane) polymer commercially-available from Huls Chemicals. Higher boiling point solvents such as N-methyl pyrrolidone (BPt. about 202° C.) or acetophenone (BPt. about 202° C.) or 1,2 bis(2-methoxy-ethoxy)ethane (PBt 222°–227° C.), with the addition of a minor percentage of xylene, provide composite paste compositions having excellent shelf life. Such composition can incorporate higher melting metal alloy powder fillers, have higher reflow temperatures, and have been found to provide low contact resistance of less than about 50 millihoms, and high bonding strengths, greater than about 0.35 pounds per lead.

Other thermoplastic polymers are also suitable provided that they are acid-resistant, thermally stable and heat-softenable at or below the maximum reflow temperature of the composite paste in which they are incorporated, generally between about 160° C. and 250° C., and are soluble in a volatile organic solvent which has a boiling point below said reflow temperature and above the melting point of said alloy powder. Suitable thermoplastic polymers include polyesters, polyvinyl chloride or fluoride, polyamides and other polymers which will be apparent to those skilled in the light of the present disclosure.

The final essential ingredient of the composite paste is the transient flux, which is a reducing agent such as an organic acid, having a boiling point which is higher than the melting temperature of the metal alloy powder particles and lower than the maximum reflow temperature of the paste composition. Thus, the transient flux is present in the paste when the metal filler particles are melted to provide flux activity on the particles, removing oxides therefrom, as well as removing oxides from the pads of the receptor board and from the component leads, subsequently evaporating completely at the reflow temperature.

The particular transient flux material used in any of the present composite paste compositions will depend upon the melting and reflow temperature of the metal alloy powder filler, and the boiling point of the solvent. Preferred transient fluxes are the aliphatic monocarboxylic acids having boiling points between about 140° C. and 200° C., including propionic acid, butyric acid, valeric acid and caproic acid, i.e. $C_4$ to $C_6$ aliphatic acids. However other acidic materials are also suitable such as 2-methoxy benzoic acid and other carboxylic acids. The fluxing agent generally is present in an amount between about 0.5% and 1.5% by weight of the composite paste, most preferably between about 0.6 and 1.0% by weight.

The solder paste composition also preferably includes between about 0.4 and 1.0% by weight of a liquid transient surfactant, such as ethylene glycol or glycerine, having a boiling point above the melting point of the alloy powder and which is evaporable below the reflow temperature of the paste composition, i.e., between about 140° C. and 250° C., most preferably between about 160° C. and 220° C.

The following Examples are given as illustrative and should not be considered limitative.

EXAMPLE 1

| Ingredient | Weight % |
| --- | --- |
| Bi(5–8%)-Sn(42%) alloy powder | 89.9 |
| Polyimide siloxane polymer | 2.1 |
| N-methyl pyrrolidone | 6.4 |
| Xylene | 0.4 |
| Butyric acid | 0.70 |
| Ethylene glycol | 0.50 |
| Reflow temperature = 175°–180° C. | |

EXAMPLE 2

| Ingredients | Weight % |
| --- | --- |
| Pb(37%)-Sn(63%) alloy powder | 89.9 |
| Polyimide siloxane polymer | 2.1 |
| 1,2-bis(2-methoxy-ethoxy ethane) | 6.1 |
| Xylene | 0.4 |

-continued

| Ingredients | Weight % |
| --- | --- |
| Valeric acid | 0.9 |
| Glycerol | 0.6 |
| Reflow temperature = 210°–220° C. | |

EXAMPLE 3

| Ingredients | Weight % |
| --- | --- |
| Bi(46%)-Sn(34%)-(Pb(20%) alloy powder | 90.0 |
| Polyimide siloxane polymer | 2.1 |
| N-methyl pyrrolidone | 6.4 |
| Xylene | 0.4 |
| Propionic acid | 0.6 |
| Ethylene glycol | 0.5 |
| Reflow temperature = 160°–165° C. | |

The powder pastes of the foregoing examples, illustrative of suitable compositions according to the present invention, are produced by uniformly mixing the ingredients to form a homogeneous paste suitable for dispensing upon the receptor contact pads of a printed circuit board (PCB). The paste, has an excellent shelf life or resistance to drying out or solidifying at ambient room temperatures. The paste can be dispensed on screen—printed upon the pad areas and partially dried by evaporation of the solvents to form highly viscous (i.e. semi-solid) reflowable tacky electrical contact areas.

The soldering process is conducted by placing the leads of an electrical component on the partially dried paste-covered pad areas of the PCB, and heating to reflow temperatures, preferably by ramping the temperature up at the rate of about 20° C. per minute to the maximum reflow temperature indicated by the foregoing examples, followed by cooling after a period of about one minute or so.

During the reflow process the metal powder filler particles partially coalesce in the presence of the transient flux to form a partially coalesced interconnected network structure having excellent electrical conductivity and low contact resistance. The flux removes oxides from the metal alloy powder and from the pads and the leads so that metal-to-metal contacts are provided between the metal powder particles and the pad and the leads during reflow. After this is accomplished the transient flux and surfactant, if present, evaporate and any residual solvents evaporate to form the polymer-reinforced metal alloy interconnected network connection.

An important advantage of the present invention is that the polymer-metal alloy composite connections can be reworked at low remelt temperatures, by simply pulling the component above the softening temperature of the reinforcing polymer matrix which is at or below the reflow temperature. Thus electrical components can be desoldered from the PCB for replacement at low temperatures which do not damage heat-sensitive components. During reworking, the polymer is heat-softened while the partially coalesced metal alloy particles are also melted to release their interconnections. Alternatively, rework can be performed at low remelt temperature, by applying a small amount of the original solvent to the solder connection. During reworking, the polymer is heat-softened and dissolved by the solvent while the metal alloy particles are also melted to release the interconnections.

This permits the original electrical component to be pulled or lifted freely out of engagement with the pad areas of the PCB. Old solder remaining on the pads can be removed in conventional manner if desired, such as by a heated copper wick, and new paste can be applied to the pad areas, if required, by a conventional dispensing or screening method. Finally a replacement component can be pick-place-attached by a local heating thermode or other heating means such as a resistive blade, hot gas or resistive wire.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. A composite polymer-solder paste having a maximum reflow temperature above the melting temperature of a metal alloy powder filler therein and having a rework temperature below said reflow temperature, said paste consisting essentially of at least about 85% by weight of a meltable eutectic metal alloy powder filler which is substantially free of noble metals, a minor amount equal to at least about 6% by weight of a solution of a thermoplastic polymer having a softening temperature which is higher than the melting temperature of said metal alloy powder filler and is below said reflow temperature and which is thermally stable at said maximum reflow temperature, dissolved in a volatile organic solvent having a boiling temperature above the melting temperature of said alloy powder filler and below said reflow temperature, and a lesser amount equal to at least about 0.5% by weight of a transient acidic fluxing agent comprising a metal oxide-reducing agent having a boiling temperature above the melting temperature of said metal alloy powder filler and below said reflow temperature, the reflow of said paste producing an electroconductive solder connection which is substantially free of said fluxing agent and said solvent and which comprises a polymer-reinforced partially coalesced interconnected network of said metal alloy powder, said electroconductive solder connection being reworkable at low remelt temperatures by heating above the softening temperature of said reinforcing polymer but below said maximum reflow temperature.

2. A composite polymer-solder paste according to claim 1 in which said metal alloy powder comprises bismuth and tin.

3. A composite polymer-solder paste according to claim 1 in which said metal alloy powder is free of lead.

4. A composite polymer-solder paste according to claim 1 in which said polymer comprises a poly(imide siloxane) polymer.

5. A composite polymer-solder paste according to claim 1 in which said volatile solvent is selected from the group consisting of N-methyl pyrrolidone, 1,2-bis(2-methoxy-ethoxy)ethane and methyl phenyl ketone.

6. A composite polymer-solder paste according to claim 1 in which said fluxing agent comprises a carboxylic acid.

7. A composite polymer-solder paste according to claim 1 which further includes a said lesser amount equal to at least about 0.4% by weight of a fugitive liquid surfactant having a boiling temperature below said reflow temperature.

8. A composite polymer-solder paste according to claim 7 in which said surfactant is selected from the group consisting of ethylene glycol and glycerine.

9. A composite polymer-solder paste according to claim 1 comprising from about 85% to 93% by weight of said meltable eutectic metal powder filler, from about 6% to 14% by weight of said thermoplastic polymer solution, and from about 0.5% to 1.5% by weight of said transient fluxing agent.

10. A method for producing a conductive interconnection between leads of an electrical component and electroconductive pad elements at a maximum reflow temperature, which connection is reworkable below said reflow temperature which comprises:
   (a) contacting said leads with a polymer-solder paste having a reflow temperature above the melting temperature of a metal powder filler therein, said paste consisting essentially of at least about 85% by weight of a meltable metal alloy powder filler which is substantially free of noble metals, a minor amount equal to at least about 6% by weight of a solution of a thermoplastic polymer having a softening temperature which is higher than the melting temperature of said metal powder filler and below said maximum reflow temperature and which is thermally stable at reflow temperature, dissolved in a volatile organic solvent having a boiling temperature above the melting temperature of said alloy powder and below said reflow temperature, and a lesser amount equal to at least about 0.5% by weight of a transient acidic fluxing agent comprising a metal oxide-reducing agent having a boiling temperature above the melting temperature of said alloy powder and below said reflow temperature;
   (b) heating said paste to said maximum reflow temperature to melt said powder filler in the presence of said polymer and fluxing agent, causing the reduction of any metal oxides in said metal powder filler and on said leads, welding said alloy powder particles to form a polymer-reinforced matrix containing partially coalesced interconnected network metal connections between said leads, and evaporating said transient fluxing agent and any residual volatile organic solvent at or below said reflow temperature, and
   (c) cooling said connection to form one which can be reworked by heating to a temperature above the softening temperature of said reinforcing polymer but below said maximum reflow temperature.

11. A method according to claim 10 in which said paste has a reflow temperature between about 140° C. and 250° C.

12. A method according to claim 10 in which the temperature of said paste is increased in increments, through the melting temperature of said metal alloy powder filler, to said maximum reflow temperature.

13. A method according to claim 10 in which said component is disposed on a polymer based substrate/PCB, and said polymer paste has a reflow temperature commensurate with the thermal stability of the substrate/PCB, and the thermal sensitivity of the component.

14. A method according to claim 10 in which said component is disposed on a ceramic substrate and said polymer paste has a reflow temperature commensurate with the thermal stability of the reinforcing polymer matrix, and the thermal sensitivity of the component.

15. A method for reworking an interconnection between leads of an electrical component and electroconductive pad elements, which interconnection is produced according to the method of claim 10, which comprises applying to said interconnection a small quantity of a volatile organic solvent for the thermoplastic polymer present in said interconnection, and pulling said interconnection while heating to a temperature which is at or above the softening temperature of the polymer matrix of said interconnection.

16. A method for reworking an interconnection between leads of an electrical component and electroconductive pad elements, which interconnection is produced according to the method of claim 10, which comprises pulling said interconnection while heating to a temperature which is at or above the softening temperature of the polymer matrix of said interconnection.

* * * * *